US006805816B1

(12) United States Patent
Groenendaal et al.

(10) Patent No.: US 6,805,816 B1
(45) Date of Patent: Oct. 19, 2004

(54) METHOD OF PRODUCING π-CONJUGATED POLYMERS

(75) Inventors: Lambertus Groenendaal, Sinaai (BE); Friedrich Jonas, Aachen (DE); Harald Pielartzik, Krefeld (DE); Helmut Ritter, Wuppertal (DE); Joachim Storsberg, Wörrstadt (DE)

(73) Assignee: Bayer Aktiengesellschaft, Leverkusen (DE)

( * ) Notice: Subject to any disclaimer, the term of this patent is extended or adjusted under 35 U.S.C. 154(b) by 0 days.

(21) Appl. No.: 09/979,368

(22) PCT Filed: May 8, 2000

(86) PCT No.: PCT/EP00/04107

§ 371 (c)(1),
(2), (4) Date: Nov. 16, 2001

(87) PCT Pub. No.: WO00/72331

PCT Pub. Date: Nov. 30, 2000

(30) Foreign Application Priority Data

May 20, 1999  (DE) ......................................... 199 23 140
Jul. 6, 1999   (DE) ......................................... 199 31 114

(51) Int. Cl.$^7$ ............................................... H01B 1/12
(52) U.S. Cl. .................................................... 252/500
(58) Field of Search ......................... 252/500; 528/210, 528/214, 378, 422

(56) References Cited

U.S. PATENT DOCUMENTS

| | | | | |
|---|---|---|---|---|
| 5,194,313 | A | 3/1993 | Hupe et al. | 428/137 |
| 5,403,467 | A | 4/1995 | Jonas et al. | 295/125 |
| 6,593,399 | B1 * | 7/2003 | La Fleur et al. | 523/201 |
| 6,635,729 | B1 * | 10/2003 | Groenendaal et al. | 526/256 |

OTHER PUBLICATIONS

U.S. application Ser. No. 60/137,574, filed Jun. 4, 1999.*
Prog. Polym. Sci. vol. 23, pp. 57–79, (month unavailable) 1998, Intrinsically electrically Conducting Polymers, Synthesis, Characterization, and Their Applications, John D. Stenger–Smith.
Polymer vol. No. 22, pp. 5017–5047, (month unavailable) 1996, Synthesis, processing and material properties of conjugated polymers, W. H. Feast, J. Tsibouklis, K.L. Pouwer, L. Groenendaal and E. W. Meijer.
Chemical Physics Letters 277, Oct. 3, 1997, pp. 44–50, Observation of α–terthiophene excited dimer fluorescence in aqueous solutions of γ–cyclodextrin, Steven De Feyter, Jan van Stam, Frank Imans, Lucien Viaene, Frans C. De Schryver, Christopher H. Evans.

Chinese Chemical Letters, vol. 3, No. 2, pp. 129–132, (month unavailable) 1992, Investigation of the Middle Redox Peak of Polyaniline on the Cyclic Voltammogram, Shao Jun Dong, Dong Bo Zhang and Zhuang Li.
J. Chim. Phys. (month unavailable) 1998, 95, pp. 1208–1212, Electropolymerisation de complexes d'inclusion: vers des fils electriques moleculaires encapsules, C. Lagrost, J.C. Lacroix, S. Aeiyach, M. Jouini, K.I. Chane–Ching et P.C. Lacaze.
Advanced Materials, (month unavailable) 1992, 4, pp. 116–118, Poly(alkylenedioxythiophene)s–New, Very Stable Conducting Polymers, Gerhard Heywang, Friedrich Jones.
Römpp Lexikon, Chemie [Rompps Lexicon of chemistry], $10^{th}$ edition (month unavailable) 1997 pp. 845–846.
Chem. Rev. (month unavailable) 1998, 98, pp. 1919–1958, Synthetic Cyclic Oligosaccharides, Giuseppe Gattsuo, Sergey A. Nepogodiev, and J. Fraser Stoddart.
Chem. Rev. (month unavailable) 1998, 98, pp. 1743–1753, Introduction and General Overview of Cyclodextrin Chemistry, Jozsef Szejtli.
J. Chim. Phys. (month unavailable) 1998, 95, pp. 119–1199, Monomeres dipyrroliques a caractere hydrophobe: etude electrochimique et polymerisation en milieu aqueux via des molecules cages. K.I. Chane–Ching, J.C. Lacroix, R. Baudry, M. Jouini, S. Aeiyach, C. Lion et P.C. Lacaze English AB.
Handbook Conducting Polymer, vol. 1, (month unavailable) 1986, pp. 1–57, Electronic Structure and Optical Response of Highly Conducting and Semiconducting Conjugated Polymers and Oligomers, J.L. Bredas, J. Cornil, F. Meyers, and D. Beljonne.
Chane–Ching, Kathleen I. et al: "Electropolymerization of hydrophobic dipyrrolyls in aqueous medium based on inclusion chemistry" J. Maer. Chem. (1999), 9(5), 1065–1070,m May 18, 1999, XP000860715, p. 1068–p. 1069; table 6.
Lagrost, C. et al: "Host–guest complexation: a new strategy for electrodeposition of processable polythiophene composites from aqueous medium" Chem. Commun. (Cambridge) (1998), (4), 489–490, XP002144876 cited in the application the whole document.

* cited by examiner

Primary Examiner—Mark Kopec
(74) Attorney, Agent, or Firm—Diderico van Eyl; Godfried R. Akorli

(57) ABSTRACT

The invention relates to a process for the preparation of π-conjugated polymers by
(1) complexing a monomeric compound with a cyclodextrin, and
(2) polymerizing the complexed compound using a chemical oxidant.

5 Claims, No Drawings

METHOD OF PRODUCING π-CONJUGATED POLYMERS

The invention relates to the preparation of π-conjugated polymers of high electrical conductivity by chemical oxidation of the complexed monomeric compounds, and to a process for the preparation of through-contacted circuit boards and multilayers.

The π-conjugated polymer class of compounds has been the subject-matter of numerous publications in recent decades. They are also known as conductive polymers or synthetic metals.

Owing to the considerable delocalization of the π-electrons along the main chain, these polymers exhibit interesting (non-linear) optical properties and, after oxidation or reduction, are good electronic conductors. These compounds will consequently probably take on a leading and active role in various practical areas of application, such as, for example, in data storage, optical signal processing, the suppression of electromagnetic interference (EMI) and solar energy conversion, and in rechargeable batteries, light-emitting diodes, field-effect transistors, circuit boards, sensors and antistatic materials.

Examples of known π-conjugated polymers are polypyrroles, polythiophenes, polyanilines, polyacetylenes, polyphenylenes and poly(p-phenylene-vinylenes). They can be prepared by various chemical and electrochemical polymerization methods (Stenger-Smith, J. D. *Prog. Polym. Sci.* 1998, 23, 57–79, Feast, W. J.; Tsibouklis, J.; Pouwer, K. L.; Groenendaal, L.; Meijer, E. W. Polymer 1996, 37, 5017–5047).

For the industrial preparation of these π-conjugated polymers, chemical polymerization of the monomeric compounds is the most favourable process. Numerous problems occur in this process:

1) The low solubility of the monomeric compounds in water means that it is frequently necessary to use less environmentally friendly organic solvents, such as, for example, chloroform, methylene chloride or acetonitrile.
2) Many monomeric compounds generate an unpleasant and unhealthy odour.
3) The pure or dissolved monomeric compounds are frequently unstable on exposure to air and/or light, causing (partial) degradation to take place.

Surprisingly, it has now been found that the above-mentioned problems in the chemical polymerization of the monomeric compounds can be avoided by complexing the monomeric compounds with cyclodextrins (CDs).

The complexing of monomeric compounds with cyclodextrins and the subsequent electrochemical polymerization of the CD complexes is known. DeFeyter et al. (Chem. Phys. Lett. 1997, 277, 44–50) have investigated the α-terthiophene/γ-CD complex using excited dimer fluorescence in aqueous solutions. Dong et al. (Chin. Chem. Lett. 1992, 3(2), 129–132) have polymerized an aniline/α-CD complex by an electrochemical method in order to exclude a certain theory relating to by-products which form in the electrochemical formation of polyaniline. Lasace et al. (Chem. Commun. 1998, 489; J. Chim. Phys. 1998, 95, 1208–1212) have reported on the electrochemical polymerization of a 2,2'-bithiophene/hydroxypropyl-β-CD complex in water.

Recently, the same group of authors has also reported on the electrochemical polymerization of a plurality of N,N-substituted dipyrrole derivatives which have been complexed with hydropropyl-β-CD (J. Chim. Phys. 1998, 95, 1196–1199).

However, none of the cited publications reports on the possibility of chemical polymerization of monomer/CD complexes. Likewise, nothing is reported on the use of these complexes for the stabilization of monomeric compounds and the very significant reduction in odour due to the complexing.

The invention therefore relates to a process for the preparation of π-conjugated polymers comprising at least the following steps:

1. complexing of a monomeric compound with a cyclodextrin, and
2. polymerization of the complexed compound using a chemical oxidant.

Examples of monomeric compounds are unsubstituted or substituted pyrrole, aniline, thiophene, vinyl and benzyl derivatives, or combinations of these compounds. Preference is given to pyrroles and thiophenes.

Particularly preferred monomers are pyrrole and 3,4-ethylenedioxythiophene (EDT).

Suitable substituents are alkyl and alkoxy groups having from 1 to 30 carbon atoms.

Suitable cyclodextrins for the preparation of monomer/cyclodextrin complexes are unsubstituted and substituted cyclodextrins.

Preferred cyclodextrins are α-, β- and γ-cyclodextrins and esters, alkyl ethers, hydroxyalkyl ethers, alkoxycarbonylalkyl ethers and carboxyalkyl ether derivatives thereof, or salts thereof.

Particular preference is given to methyl-α-cyclodextrin, methyl-β-cyclodextrin, methyl-γ-cyclodextrin, ethyl-β-cyclodextrin, butyl-α-cyclodextrin, butyl-β-cyclodextrin, butyl-γ-cyclodextrin, 2,6-dimethyl-α-cyclodextrin, 2,6-dimethyl-β-cyclodextrin, 2,6-dimethyl-γ-cyclodextrin, 2,6-diethyl-β-cyclodextrin, 2,6-dibutyl-β-cyclodextrin, 2,3,6-trimethyl-α-cyclodextrin, 2,3,6-trimethyl-β-cyclodextrin, 2,3,6-trimethyl-γ-cyclodextrin, 2,3,6-trioctyl-α-cyclodextrin, 2,3,6-trioctyl-β-cyclodextrin, 2,3,6-triacetyl-α-cyclodextrin, 2,3,6-triacetyl-β-cyclodextrin, 2,3,6-triacetyl-γ-cyclodextrin, (2-hydroxy)propyl-α-cyclodextrin, (2-hydroxy)propyl-β-cyclodextrin, (2-hydroxy)propyl-γ-cyclodextrin, partially or fully acetylated and succinylated α-, β- or γ-cyclodextrin, 2,6-dimethyl-3-acetyl-β-cyclodextrin and 2,6-dibutyl-3-acetyl-β-cyclodextrin.

The mono-, di- or triethers, mono-, di- or triesters or monoester/diether substituted derivatives are generally obtained by etherification of α-, β- and γ-cyclodextrins using alkylating agents, such as, for example, dimethyl sulphate or alkyl halides having from 1 to 30 carbon atoms, such as, for example, methyl, ethyl, propyl, butyl, pentyl, hexyl, heptyl or octyl chloride, bromide or iodide, and/or esterification using acetic acid or succinic acid in the presence of acids.

Examples of suitable oxidants are Fe(III) salts, in particular $FeCl_3$, $H_2O_2$, $K_2Cr_2O_7$, $K_2S_2O_8$, $Na_2S_2O_8$, $KMnO_4$, alkali metal perborates and alkali metal or ammonium persulphates. Further suitable oxidants are described, for example, in Handbook of Conducting Polymers (Ed. Skotheim, T. A.), Marcel Dekker: New York, 1986, Vol. 1, 46–57.

Methods for the preparation of the monomeric compounds are generally well known and are described in detail, for example, in Handbook of Conducting Polymers (Ed. Skotheim, T. A.), Marcel Dekker: New York, 1986, Vol. 1, 1–43; Feast, W. J.; Tsibouklis, J.; Pouwer, K. L.; Groenendaal, L.; Meijer, E. W., Polymer 1996, 37, 5017–5047, and G. Heywang; F. Jonas, Adv. Mater. 1992, 4, 116–118.

Methods for the preparation of cyclodextrins are like-wise known and are described in detail, for example, in "Römpp Lexikon Chemie" [Römpp's Lexicon of Chemistry], 10th Edition, Stuttgart/New York, 1997, pp. 845 ff., and Chemical Reviews 98 (1998) 1743–1753 and 1919–1958.

In a preferred embodiment of the invention, the complexing of the monomeric compound is carried out in a monomer/cyclodextrin molar ratio of 1:1–1.2.

The problems mentioned at the outset can be avoided by the process according to the invention. Depending on the type of cyclodextrin, it is possible to prepare more or less water-soluble complexes, which have the following significant advantages:

1) The water solubility of the monomer is drastically increased on use of one or more mole-equivalents of the cyclodextrin (for example the water solubility of 3,4-ethylenedioxythiophene can be increased by more than 30 fold using 2,6-dimethyl-β-cyclodextrin). This enables chemical polymerizations to be carried out in water with much higher monomer concentrations.

2) The odour of the monomer disappears on use of one or more mole-equivalents of the cyclodextrin since the vapour pressure is drastically reduced.

3) In its cyclodextrin-complexed form, the monomer does not discolour on exposure to air and light. This applies both to the water-dissolved complex and to the pure, solid complex.

It is noteworthy that the complex can easily be separated into the individual compounds by using an organic solvent or heat. The complex thus offers a very interesting possibility for the storage and/or transport of sensitive monomers. Furthermore, the monomer/cyclodextrin complexes can be characterized easily by methods such as, for example, UV spectroscopy, fluorescence spectroscopy, infra-red spectroscopy, NMR spectroscopy, mass spectroscopy, cyclic voltammetry and in some cases by X-ray structural analysis.

Besides using chemical oxidants, the complexes can also be polymerized electrochemically.

Electrochemical polymerizations can be carried out in aqueous solutions of, for example, $LiClO_4$ as electrolyte using a conventional electrochemical arrangement.

Particularly important areas of application of the π-conjugated polymers prepared by the process according to the invention are, for example:

data storage, optical signal processing, suppression of electromagnetic interference (EMI), solar energy conversion, rechargeable batteries, light-emitting diodes, field-effect transistors, sensors, antistatic materials, and through-contacting of circuit boards and multilayers.

The particularly high stability of the cyclodextrin complexes makes them of considerable interest for the protection of sensitive monomeric compounds.

A further advantage is that the cyclodextrin can be re-used after polymerization of the complexed monomer.

A particularly important potential application of the cyclodextrin complexes is their use in the through-contacting of circuit boards and multilayers.

Two- and multilayered circuit boards contain a multiplicity of drilled holes which have to be metallized in order that the current can be transported from one conductor track level to the second and conventional electronic components can be connected to the circuit board in a conductive manner. The drilled holes initially do not conduct the electrical current and are therefore provided, for through-contacting, with a thin (2 to 3 μm) copper layer in chemical copper baths.

Processes have recently become important in which the use of chemical copper baths is omitted and in which copper is deposited directly on the walls of drilled holes in circuit boards by electroplating. To this end, it is necessary to provide the walls of the drilled hole with an electrically conductive coating before the deposition of the copper by electroplating. This coating must be applied evenly and in addition must be sufficiently electrically conductive in order to serve as the basis for flaw-free deposition of copper over the full surface by electroplating (through-contacting).

The cyclodextrin complexes that have now been found can easily and rapidly be polymerized directly on the circuit board.

The invention therefore furthermore relates to a process for the production of through-contacted circuit boards and multilayers, characterized in that a conductive layer of a π-conjugated polymer is formed on the walls of the drilled holes by treatment with a solution or emulsion of a cyclodextrin complex of a monomeric compound, and a metal is deposited on this layer by electroplating.

Compared with the processes described in the literature, for example U.S. Pat. No. 5,194,313, the use of the cyclodextrin complexes prevents the environment from being contaminated with evaporating monomers, in particular on use of low-boiling monomeric compounds.

Preference is given to the use of a cyclodextrin complex of an unsubstituted or substituted pyrrole or thiophene derivative.

Particular preference is furthermore given to the use of a cyclodextrin complex of pyrrole or 3,4-ethylene-dioxythiophene.

The process according to the invention comprises the following process steps:

1. Production of drilled holes in the copper-laminated boards (base materials)
2. Oxidative pre-treatment of the drilled holes
3. Rinsing with water
4. Treatment with a solution or emulsion of a cyclodextrin complex of a monomeric compound
5. Treatment with an acid
6. Rinsing with water
7. Deposition of copper by electroplating Process steps 4 and 5 can be combined into a single step. This embodiment is preferred. Steps 1, 2, 3, 6 and 7 correspond to the prior art and are carried out in a manner known per se. In step 2, the oxidant used is preferably potassium permanganate.

The cyclodextrin complexes can be employed in process step 4 in a concentration of from 1 to 60% by weight, preferably from 10 to 50% by weight, based on the solution or emulsion as a whole.

Further details of the process, in particular information regarding the type of acids, solvents and further auxiliaries used, are known and are described in EP-A-553 671.

EXAMPLES

In the following experiments, a methylated β-cyclodextrin having an average degree of methylation of 1.8 per glucose unit was used.

Example 1
Preparation of an EDT/cyclodextrin Complex 64 g (0.45 mol) of EDT are added to an aqueous solution of 2,6-dimethyl-β-cyclodextrin (600 g (0.45 mol) dissolved in 1 l of water). After a few minutes, a clear solution is obtained. The complex formation can be accelerated by ultrasound or by shaking the flask.

The EDT/cyclodextrin complex is very stable and substantially protected against oxidation. No discoloration is observed, even after extended standing in air.

Preparation of a Pyrrole/cyclodextrin Complex 30.22 g (0.45 mol) of pyrrole are added to an aqueous solution of 2,6-dimethyl-β-cyclodextrin (600 g (0.45 mol ) dissolved in 1 l of water). After a few minutes, a clear solution is obtained. The complex formation can be accelerated by ultrasound or by shaking the flask.

The pyrrole/cyclodextrin complex is very stable and substantially protected against oxidation. No discoloration is observed, even after extended standing in air.

The following table illustrates the different properties of pyrrole and EDT on the one hand and the corresponding cyclodextrin complexes on the other hand. The cyclodextrin employed was in each case 2,6-dimethyl-β-cyclodextrin.

TABLE

| | Monomer | Monomer/CD complex (molar ratio 1:1.05) |
|---|---|---|
| Solubility (in water at 20° C.) | Pyrrole: 50 g/l<br>EDT: 2.1 g/l | Pyrrole: >100 g/l<br>EDT: >80 g/l |
| Odour | Pyrrole: very strong unpleasant<br>EDT: very strong, unpleasant | In aqueous solution:<br>Pyrrole: minimal odour<br>EDT: minimal odour<br>As solid:<br>Pyrrole: minimal odour<br>EDT: minimal odour |
| Stability | Pyrrole: discoloration in air after only a few hours<br>EDT: discoloration in air after only a few hours | In aqueous solution:<br>Pyrrole: no discoloration<br>EDT: no discoloration<br>As solid:<br>Pyrrole: no discoloration<br>EDT: no discoloration |

Example 2
Preparation of an EDT/cyclodextrin Complex and Subsequent Chemical-oxidative Polymerization a) 10 g (7.5 mmol) of 2,6-dimethyl-β-cyclodextrin are dissolved in 30 ml of $H_2O$. 1.065 g (7.5 mmol) of 3,4-ethylenedioxythiophene (EDT) are added to this solution. The solution is stirred vigorously (for about 10 minutes) or treated with an ultrasound unit (10 seconds), giving a clear, homogeneous solution. The formation of the complex compound can be demonstrated by means of NMR (shifts in $^1$H-NMR in $D_2O$ of 0.2 ppm) or fluorescence spectroscopy (drastic increase in the fluorescence intensity of EDT in $H_2O$ on addition of 2,6-dimethyl-β-cyclodextrin).

b) 5.0685 g (18.75 mmol) of $FeCl_3 \times 6H_2O$ are added to the solution prepared under a), and the mixture is stirred at 70° C. After 12 hours, the resultant poly (ethylenedioxythiophene) is filtered off with suction through a membrane filter (5 μm). The filter residue is re-suspended twice in 50 ml of hot water and filtered off with suction; subsequently re-suspended in 50 ml of methanol, filtered off with suction and dried for 5 hours at 60° C. in a vacuum drying oven.

Yield: 0.9 g

Example 3
Preparation of a Pyrrole/cyclodextrin Complex and Subsequent Chemical-oxidative Polymerization a) 10 g (7.5 mmol) of 2,6-dimethyl-β-cyclodextrin are dissolved in 30 ml of $H_2O$. 0.5 g (7.5 mmol) of pyrrole are added to this solution. This solution is stirred vigorously (for about 1 minute) giving a clear, homogeneous solution. The formation of the complex compound can be demonstrated by means of $^1$H-NMR or fluorescence spectroscopy.

b) 2.53 g (9.38 mmol) of $K_2S_2O_8$ are added to the solution prepared under a), and the mixture is stirred at 30° C. After a reaction time of 6 hours, the resultant polypyrrole is filtered off with suction through a membrane filter (5 μm). The filter residue is re-suspended twice in 50 ml of hot water and filtered off with suction; subsequently re-suspended in 50 ml of methanol, and dried for 5 hours at 60° C. in a vacuum drying oven.

Yield: 0.45 g

Example 4
Through-contacting

Epoxy resin boards measuring 4×4 $cm^2$ which are copper-laminated on both sides and each with 20 drilled holes 0.4 mm in diameter are immersed for 4 minutes in a solution of 6.5 g of potassium permanganate, 1 g of boric acid and 92.5 g of water at 85° C. The boards are subsequently washed with demineralized water until the water running off is colorless.

A board is immersed for 2 minutes in a solution of 3 g of pyrrole and 97 g of water (board A, solution A).

A second board is immersed for 2 minutes in a solution of 3 g of pyrrole, 65.5 g of 2,6-dimethyl-β-cyclodextrin and 97 g of water (board B, solution B).

The two boards are then immersed for 2 minutes in a 2% strength by weight aqueous polystyrenesulfonic acid solution and subsequently washed with water. The drilled holes in boards A and B are fully coated with polypyrrole. For copper plating, the boards are then copper-plated in a commercially available acidic copper bath.

The drilled holes in the two boards are fully copper-plated.

The advantage according to the invention of the use of solution B over solution A is illustrated by the following test:

In each case 100 ml of solution A and B are introduced into a 2 l measuring cylinder. A strip of filter paper soaked with 5% strength by weight aqueous iron(III) chloride solution is suspended above the solution, and the measuring cylinder is sealed with a rubber stopper. In the case of solution A, the filter strip becomes a dark colour after about 10 seconds due to the formation of polypyrrole, whereas in the case of solution B, no colour change is observed even after 2 minutes.

This experiment shows that undesired evaporation losses are avoided in practice by means of the process according to the invention.

What is claimed is:

1. A process for the preparation of π-conjugated polymers comprising
   (1) complexing a monomeric compound with a cyclodextrin, and
   (2) polymerizing the complexed compound using a chemical oxidant or electrochemical polymerization;
   wherein the monomeric compound is pyrrole or 3,4-ethylenedioxythiophene.

2. A process according to claim 1 wherein the cyclodextrin is methyl-α-cyclodextrin, methyl-β-cyclodextrin, methyl-γ-cyclodextrin, ethyl-β-cyclodextrin, butyl-α-cyclodextrin, butyl-β-cyclodextrin, butyl-γ-cyclodextrin, 2,6-dimethyl-α-cyclodextrin, 2,6-dimethyl-β-cyclodextrin, 2,6-dimethyl-γ-cyclodextrin, 2,6-diethyl-β-cyclodextrin, 2,6-dibutyl-β-cyclodextrin, 2,3,6-trimethyl-α-cyclodextrin, 2,3,6-trimethyl-β-cyclodextrin, 2,3,6-trimethyl-γ-cyclodextrin, 2,3,6-trioctyl-α-cyclodextrin, 2,3,6-trioctyl-β-cyclodextrin, 2,3,6-triacetyl-α-cyclodextrin, 2,3,6-triacetyl-β-cyclodextrin, 2,3,6-triacetyl-γ-cyclodextrin, (2-hydroxy)propyl-α-cyclodextrin, (2-hydroxy)propyl-β-cyclodextrin, (2-hydroxy)propyl-γ-cyclodextrin, partially or fully acetylated or succinylated α-, β-, or γ-cyclodextrin, 2,6-dimethyl-3-acetyl-β-cyclodextrin, or 2,6-dibutyl-3-acetyl-β-cyclodextrin.

3. A process according to claim 1 wherein the monomeric compound is complexed with the cyclodextrin at a molar ratio of 1:1 to 1:2.

4. A process according to claim 1 wherein the complexed compound is polymerized with a chemical oxidant selected from the group consisting of an Fe(III) salt, $H_2O_2$, $K_2Cr_2O_7$, $K_2S_2O_8$, $Na_2S_2O_8$, $KMnO_4$, an alkali metal perborate, and an alkali metal or ammonium persulphate.

5. A process according to claim 1 wherein the complexed compound is polymerized electrochemically in an aqueous solution.

* * * * *